(12) United States Patent
Kim et al.

(10) Patent No.: US 7,375,669 B2
(45) Date of Patent: May 20, 2008

(54) DIGITAL/ANALOG CONVERTER

(75) Inventors: Byung Hoon Kim, Seoul (KR); Won Tae Choi, Yongin (KR); Youn Joong Lee, Seoul (KR); Chan Woo Park, Ansan (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 11/379,428

(22) Filed: Apr. 20, 2006

(65) Prior Publication Data

US 2006/0284752 A1    Dec. 21, 2006

(30) Foreign Application Priority Data

Jun. 21, 2005    (KR) .................. 10-2005-0053299

(51) Int. Cl.
*H03M 1/66* (2006.01)

(52) U.S. Cl. .................. 341/145; 341/144; 341/154

(58) Field of Classification Search .............. 341/145, 341/154

See application file for complete search history.

(56) References Cited

U.S. PATENT DOCUMENTS

| | | | | |
|---|---|---|---|---|
| 3,997,892 | A | * 12/1976 | Susset ................ | 341/136 |
| 4,543,560 | A | * 9/1985 | Holloway ............ | 341/133 |
| 4,918,448 | A | * 4/1990 | Hauviller et al. ..... | 341/145 |
| 5,252,975 | A | * 10/1993 | Yuasa et al. ......... | 341/145 |
| 5,396,245 | A | * 3/1995 | Rempfer ............. | 341/145 |
| 5,495,245 | A | * 2/1996 | Ashe ................. | 341/145 |
| 5,554,986 | A | * 9/1996 | Neidorff ............. | 341/145 |
| 5,703,588 | A | * 12/1997 | Rivoir et al. ......... | 341/159 |
| 5,877,717 | A | * 3/1999 | Tu et al. ............. | 341/150 |
| 5,940,020 | A | * 8/1999 | Ho ................... | 341/145 |
| 5,999,115 | A | * 12/1999 | Connell et al. ....... | 341/145 |
| 6,166,672 | A | * 12/2000 | Park ................. | 341/145 |
| 6,181,265 | B1 | * 1/2001 | Lee .................. | 341/145 |
| 6,268,817 | B1 | * 7/2001 | Min et al. ........... | 341/145 |
| 6,831,580 | B2 | 12/2004 | Bae | |
| 7,161,517 | B1 | * 1/2007 | Yen et al. ............ | 341/145 |

FOREIGN PATENT DOCUMENTS

KR    2001-26158    4/2001

* cited by examiner

*Primary Examiner*—Khai M. Nguyen
(74) *Attorney, Agent, or Firm*—Stanzione & Kim, LLP

(57) ABSTRACT

A digital/analog converter includes a first divided-voltage generating section which divides a reference supply voltage through the voltage distribution, a decoder section which receives a digital signal so as to output a decoded selection signal, a first divided-voltage selecting section which selects and outputs a plurality of divided voltages among the divided voltages generated from the first divided-voltage generating section on the basis of the selection signal output from the decoder section, a second divided-voltage selecting section which selects and outputs a plurality of divided voltages among the divided-voltages output from the first divided-voltage selecting section on the basis of the selection signal output from the decoder section, a second divided-voltage generating section which divides the plurality of divided-voltages output from the second divided-voltage selecting section, a third divided-voltage selecting section which selects a predetermined voltage among the divided-voltages output from the second divided-voltages generating section on the basis of the selection signal output from the decoder, and a voltage output section which outputs the predetermined voltage selected from the third divided-voltage selecting section.

13 Claims, 3 Drawing Sheets

+R$_{n-1}$)/Rtot×V$_{DD}$ (n is in the range of 1 to 256).

DIGITAL/ANALOG CONVERTER

CROSS-REFERENCE TO RELATED APPLICATIONS

The application claims the benefit of Korea Patent Application No. 2005-0053299 filed with the Korea Industrial Property Office on Jun. 21, 2005, the disclosure of which is incorporated herein by reference.

BACKGROUND OF THE INVENTION

1. Field of the Invention

The present invention relates to a digital/analog converter, and more specifically, to a digital/analog converter, in which a divided-voltage generating section and a divided-voltage selecting section are added to a conventional digital/analog converter processing a digital signal with an 8-bit resolution so that a digital signal with high resolution of more than 10 bits can be processed. Further, the digital/analog converter can be miniaturized so that the size of an IC on which the digital/analog converter is mounted can be reduced.

2. Description of the Related Art

A digital/analog converter converts a digital quantity into a corresponding analog quantity. During image sensing, the digital/analog converter determines the range of digital data which is stored according to the brightness of an image, when a user inputs a digital control code. Then, the digital/analog converter converts the digital data into analog signals.

As a widely-used digital/analog converter, there are generally provided a converter using a resistance array, a converter using a capacitor, a converter using a current cell, and the like.

In such digital/analog converters according to the related art, as the number of bits of an input signal increases, the overall area of the circuit significantly increases. In the case of the converter using a resistance array, if the number of bits of an input signal increases from 8 to 10, the number of resistances which are required for the digital/analog conversion significantly increases from $256(2^8)$ to $1024(2^{10})$. The number of switches which are accordingly needed also increases significantly. Such an increase of two bits causes the overall area of the digital/analog converter to increase four times. Such an increase in an area occurs in other digital/analog converters. Further, when a semiconductor is manufactured, an increase in the area of a circuit means an increase in cost. Therefore, in order to design a low-cost digital/analog converter, a digital/analog converter with a new structure is needed, of which the overall circuit area does not increase despite an increase in the number of bits of an input signal.

FIG. 1 is a block diagram illustrating the construction of a digital/analog converter which processes a digital signal with 8-bit resolution according to the related art.

As shown in FIG. 1, the digital/analog converter, which processes a digital signal with 8-bit resolution according to the related art, is composed of a first divided-voltage generating section 101 which divides a reference supply voltage $V_{DD}$ through the voltage distribution, a decoder section 103 which receives a digital signal so as to output a decoded selection signal, a first divided-voltage selecting section 102 which selects and outputs a plurality of divided-voltages among the divided-voltages generated from the first divided-voltage generating section 101 on the basis of the output selection signal, a second divided-voltage selecting section 104 which selects and outputs a plurality of divided-voltages among the divided-voltages output from the first divided-voltage selecting section on the basis of the output selection signal, and a voltage output section 105 which outputs predetermined voltages selected from the second divided-voltage selecting section.

The first divided-voltage generating section 101 is composed of $257(2^8+1)$ resistances which are serially connected. One end thereof receives the reference supply voltage $V_{DD}$, and the other end thereof is connected to the ground GND of the circuit. Further, predetermined divided-voltages VR1 to VR256 are respectively output from the connection points between the resistances $R_0$ to $R_{256}$, that is, the nodes formed between the resistances of the first divided-voltage generating section 101.

For example, if the connection point between the resistances $R_1$ to $R_2$ is set to the first node and the total resistance of 257 serially-connected resistances is referred to as Rtot, a divided-voltage VRn which is output from the Nth node can be calculated by the following equation: $Vn = (R_0 + R_1 + \ldots + R_{n-1})/Rtot \times V_{DD}$ (n is in the range of 1 to 256).

The first divided-voltage selecting section 102 is provided with 256 switches S/W$_1$ to S/W$_{256}$ which are all composed of transistors. The switches S/W$_1$ to S/W$_{256}$ are respectively connected to the nodes formed in the first divided-voltage generating section 101.

The first divided-voltage selecting section 102 selects and outputs 16 divided-voltages among the 256 divided-voltages generated by the first divided-voltage generating section 101 on the basis of the selection signal output from the decoder section 103 which will be described below.

The second divided-voltage selecting section 104 is provided with 16 switches S/W$_{1a}$ to S/W$_{16a}$ which are composed of transistors. The 16 switches S/W$_{1a}$ to S/W$_{16a}$ are respectively connected to 16 nodes selected by the first divided-voltage selecting section 102, among the nodes formed in the first divided-voltage generating section 101.

Therefore, the second divided-voltage selecting section 104 selects and outputs one desired voltage among 16 divided-voltages selected by the first divided-voltage selecting section 102 on the basis of the selection signal output from the decoder section 103.

The decoder section 103 receives an 8-bit digital signal from outside. The decoder section 103 is composed of a first decoder 103a which decodes four higher-order bits of the 8-bit digital signal output from outside so as to output a decoded selection signal and a decoded second decoder 103b which decodes four lower-order bits thereof so as to output a selection signal.

The first divided-voltage selecting section 102 first selects 16 divided-voltages among the 256 divided-voltages generated from the first divided-voltage generating section 101 on the basis of the selection signal output from the first decoder 103a.

The second divided-voltage selecting section 104 selects one desired voltage among 16 divided-voltages selected by the first divided-voltage selecting section 102 on the basis of the selection signal output from the second decoder 103b.

The voltage output section 105 is composed of an output buffer 105a which buffers and outputs one voltage selected by the second divided-voltage selecting section 104.

The voltage selected by the second divided-voltage selecting section 104 is output to an output terminal through the output buffer 105a. Accordingly, an analog output voltage corresponding to the 8-bit digital signal output from outside is output through the output terminal of the digital/analog converter which processes a digital signal with an 8-bit resolution.

The reason why the output buffer 105a is used in the voltage output section 105 is that a desired voltage and driving speed can be realized by the characteristic of the output buffer 105a and the flickering of the distributed voltage can be prevented.

FIG. 2 is a block diagram illustrating the construction of a conventional digital/analog converter which processes a digital signal with a 10-bit resolution.

As shown in FIG. 2, the conventional digital/analog converter, which processes a digital signal with 10-bit resolution, is composed of a first divided-voltage generating section 201 which divides a reference supply voltage $V_{DD}$ through the voltage distribution, a decoder section 203 which receives a digital signal so as to output a decoded selection signal, a first divided-voltage selecting section 202 which selects and outputs a plurality of divided-voltages among the divided-voltages generated from the first divided-voltage generating section 201 on the basis of the output selection signal, the second divided-voltage selecting section 204 which selects and outputs a plurality of divided-voltages among the divided-voltages output from the first divided-voltage selecting section on the basis of the output selection signal, and a voltage output section 205 which outputs predetermined voltages selected from the second divided-voltage selecting section.

Different from the first divided-voltage generating section 101 of FIG. 1, the first divided-voltage generating section 201 is composed of 1025 ($2^{10}+1$) resistances which are serially connected, because the digital/analog converter processes a digital signal with 10-bit resolution. One end thereof receives the reference supply voltage $V_{DD}$, and the other end thereof is connected to the ground GND of the circuit. Further, predetermined divided-voltages VR1 to VR1024 are output from the connection points between the resistances $R_0$ to $R_{1024}$, that is, the nodes formed between the resistances of the first divided-voltage generating section 201.

For example, if the connection point between the resistances $R_1$ to $R_2$ is set to the first node and the total of 1025 serially-connected resistances is referred to as Rtot, a divided-voltage VRn which is output from the Nth node can be calculated by the following equation: $Vn=(R_0+R_1+ \ldots +R_{n-1})/Rtot \times V_{DD}$ (n is in the range of 1 to 1024).

Different from the first divided-voltage selecting section 102 of FIG. 1, the first divided-voltage selecting section 202 is provided with 1024 switches $S/W_1$ to $S/W_{1024}$ which are all composed of transistors. The switches $S/W_1$ to $S/W_{1024}$ are respectively connected to the nodes formed in the first divided-voltage generating section 201.

The first divided-voltage selecting section 202 selects and outputs 32 divided-voltages among 1024 divided-voltages generated by the first divided-voltage generating section 201 on the basis of a selection signal output from the decoder section 203 which will be described below.

The second divided-voltage selecting section 204 is provided with 32 switches $S/W_{1a}$ to $S/W_{32a}$ which are all composed of transistors. The switches $S/W_{1a}$ to $S/W_{32a}$ are respectively connected to 32 nodes which are selected by the first divided-voltage selecting section 202 among the nodes formed in the first divided-voltage generating section 201.

The second divided-voltage selecting section 204 selects and outputs one desired voltage among 32 divided voltages selected by the first divided-voltage selecting section 202 on the basis of the selection signal output from the decoder section 203.

The decoder section 203 receives a 10-bit digital signal from outside. The decoder section 203 is composed of a first decoder 203a which decodes five higher-order bits of the 10-bit digital signal output from outside so as to output a decoded selection signal and a decoded second decoder 203b which decodes five lower-order bits thereof so as to output a selection signal.

The first divided-voltage selecting section 202 first selects 32 divided-voltages among 1024 divided-voltages generated from the first divided-voltage generating section 201 on the basis of the selection signal output from the first decoder 203a.

The second divided-voltage selecting section 204 selects one desired voltage among 32 divided-voltages selected from the first divided-voltage selecting section 202 on the basis of the selection signal output from the second decoder 203b.

The voltage output section 205 is composed of an output buffer 205a which buffers and outputs one voltage selected by the second voltage selecting section 204.

The voltage selected by the second divided-voltage selecting section 204 is output to an output terminal through the output buffer 205a. Accordingly, the output voltage of an analog signal corresponding to the 10-bit digital signal input from outside is output through the output terminal of the digital/analog converter which processes a digital signal with 10-bit resolution.

As in FIG. 1, the output buffer 205a is used in the voltage output section 205. Therefore, a desired voltage and driving speed can be realized, and the flickering of the distributed voltage can be prevented.

However, in the conventional digital/analog converter which processes a digital signal with an 8-bit resolution as described above, there are provided the divided-voltage generating sections and divided-voltage selecting sections which are suitable for processing a digital signal with 8-bit resolution. Therefore, a digital signal with high resolution of more than 10 bits cannot be processed.

Further, in the conventional digital/analog converter which processes a digital signal with a 10-bit resolution as described above, high resolution of more than 10 bits can be obtained. However, since the number of resistances composing the divided-voltage generating section and switches composing the divided-voltage selecting section increases, the area of the circuit also increases.

SUMMARY OF THE INVENTION

An advantage of the present invention is that it provides a digital/analog converter, in which a divided-voltage generating section and a divided-voltage selecting section are added to a conventional digital/analog converter processing a digital signal with 8-bit resolution so that a digital signal with a high resolution of more than 10 bits can be processed. Further, the digital/analog converter can be miniaturized so that the size of an IC on which the digital/analog converter is mounted can be reduced.

Additional aspects and advantages of the present general inventive concept will be set forth in part in the description which follows and, in part, will be obvious from the description, or may be learned by practice of the general inventive concept.

According to an aspect of the invention, a digital/analog converter includes a first divided-voltage generating section which divides a reference supply voltage through the voltage distribution; a decoder section which receives a digital signal so as to output a decoded selection signal; a first divided-voltage selecting section which selects and outputs a plurality of divided voltages among the divided voltages generated from the first divided-voltage generating section on the basis of the selection signal output from the decoder section; a second divided-voltage selecting section which selects and outputs a plurality of divided voltages among the divided-voltages output from the first divided-voltage selecting section on the basis of the selection signal output from the decoder section; a second divided-voltage generating section which divides the plurality of divided-voltages output from the second divided-voltage selecting section; a third divided-voltage selecting section which selects a predetermined voltage among the divided-voltages output from the second divided-voltages generating section on the basis of the selection signal output from the decoder; and a voltage output section which outputs the predetermined voltage selected from the third divided-voltage selecting section.

The first divided-voltage generating section is composed of a plurality of serially-connected resistance elements.

The first divided-voltage selecting section is composed of a plurality of switches which are respectively connected to a plurality of nodes formed in the first divided-voltage generating section.

According to another aspect of the invention, the second divided-voltage selecting section is composed of a plurality of switches which are respectively connected to a plurality of nodes which are selected by the first divided-voltage selecting section and nodes which are adjacent to the plurality of nodes selected by the first divided-voltage selecting section.

The the second divided-voltage selecting section selects the voltage of the plurality of nodes selected by the first divided-voltage selecting section as a high voltage, and selects the voltage of the nodes adjacent to the plurality of nodes selected by the first divided-voltage selecting section as a low voltage.

The second divided-voltage generating section is composed of a plurality of output buffers, into which the plurality of divided-voltages are respectively input, and a plurality of serially-connected resistance elements.

In the output buffer, the plurality of divided-voltages are fed back as an auxiliary input.

The plurality of resistance elements respectively have the same resistance value.

The third-divided voltage selecting section is composed of a plurality of switches which are respectively connected to a plurality of nodes formed in the second divided-voltage generating section.

The voltage output section is composed of an output buffer which buffers and outputs the predetermined voltage selected by the third divided-voltage selecting section.

In the output buffer, the predetermined voltage is fed back as an auxiliary input.

The plurality of switches are composed of transistors.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
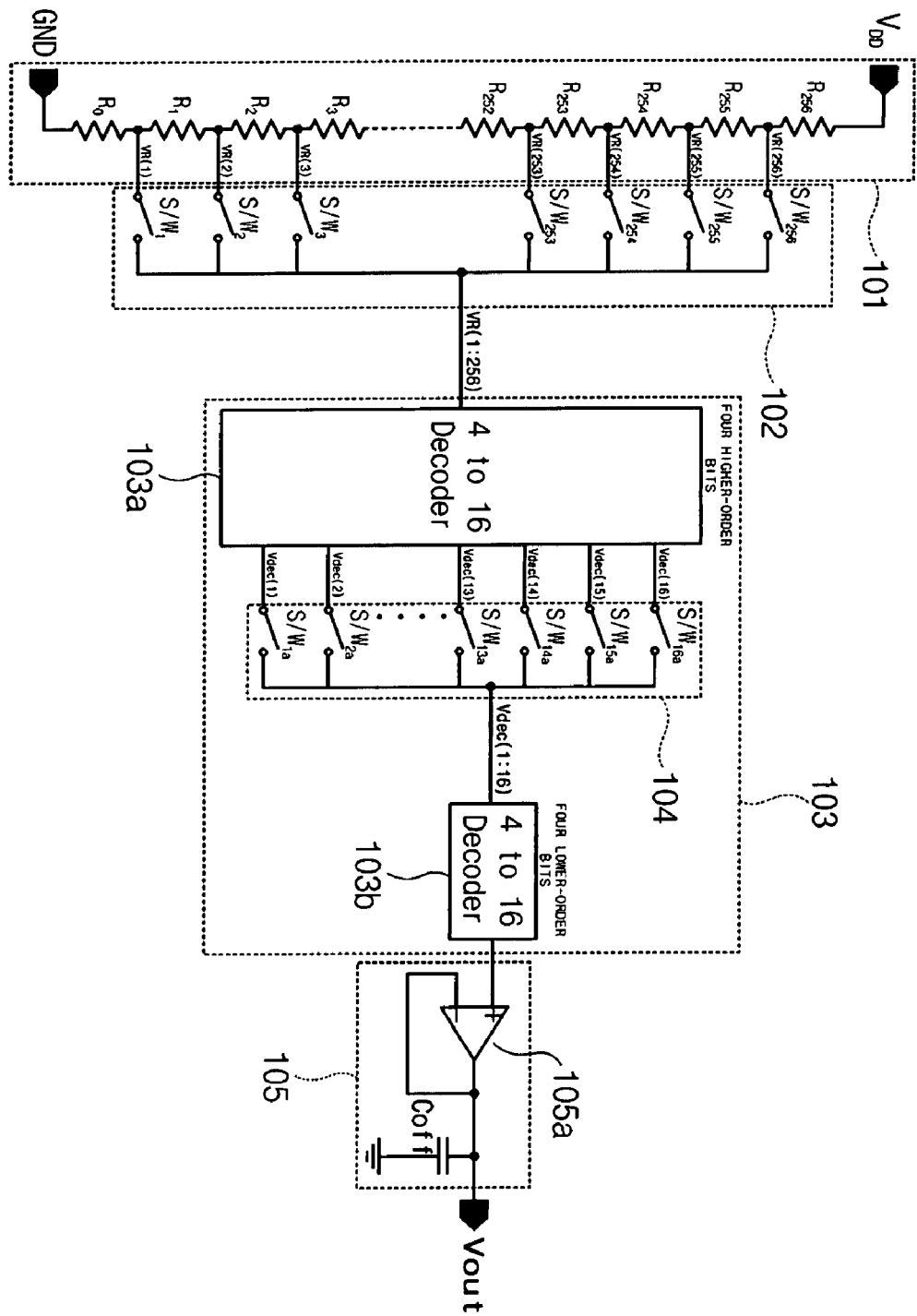
FIG. 1 is a block diagram illustrating the construction of a digital/analog converter according to the related art, which processes a digital signal with 8-bit resolution.
Figure 2:
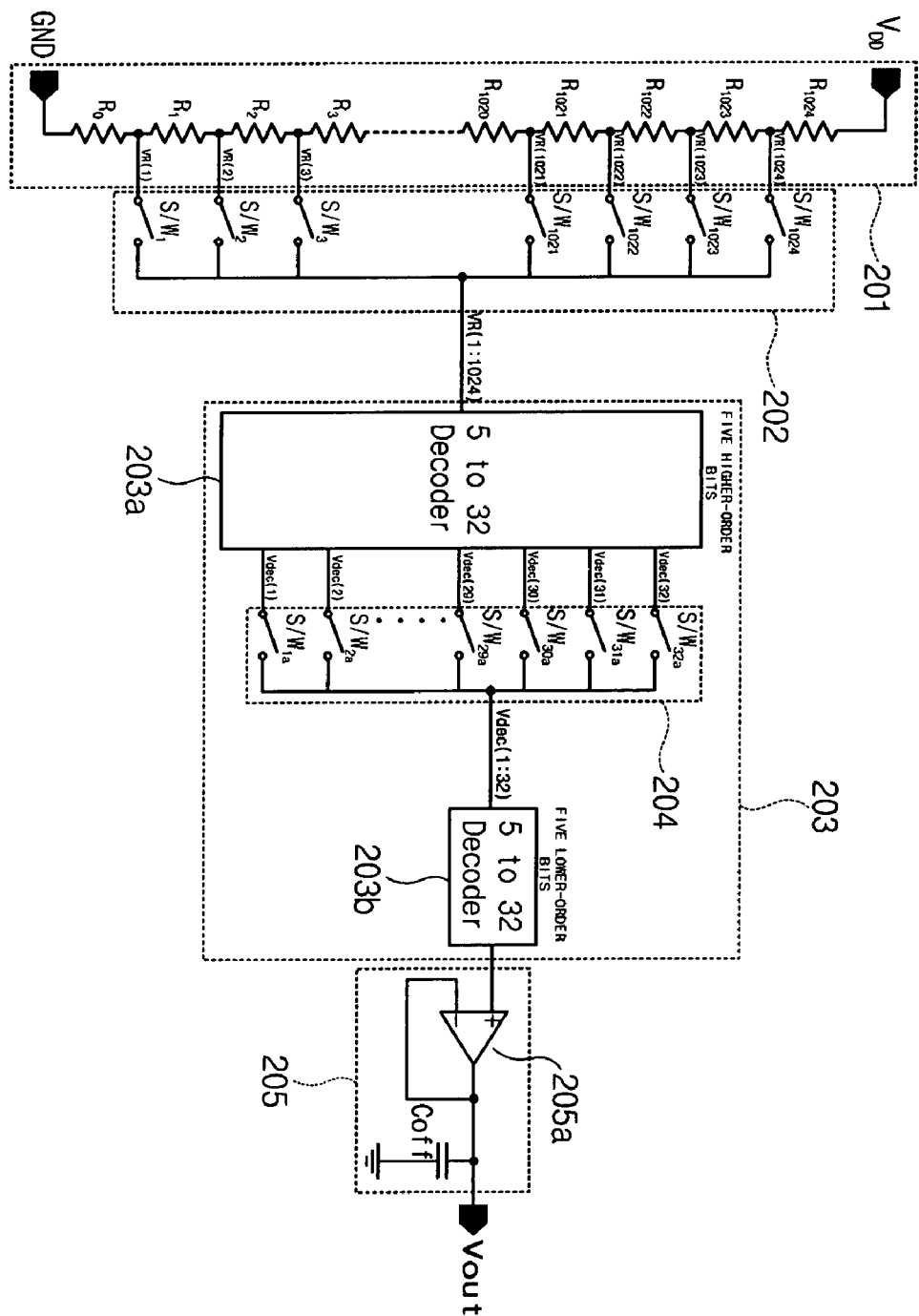
FIG. 2 is a block diagram illustrating the construction of a digital/analog converter according to the related art, which processes a digital signal with 10-bit resolution.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, an embodiment of the present invention will be described in detail with reference to the accompanying drawings.

Figure 3:
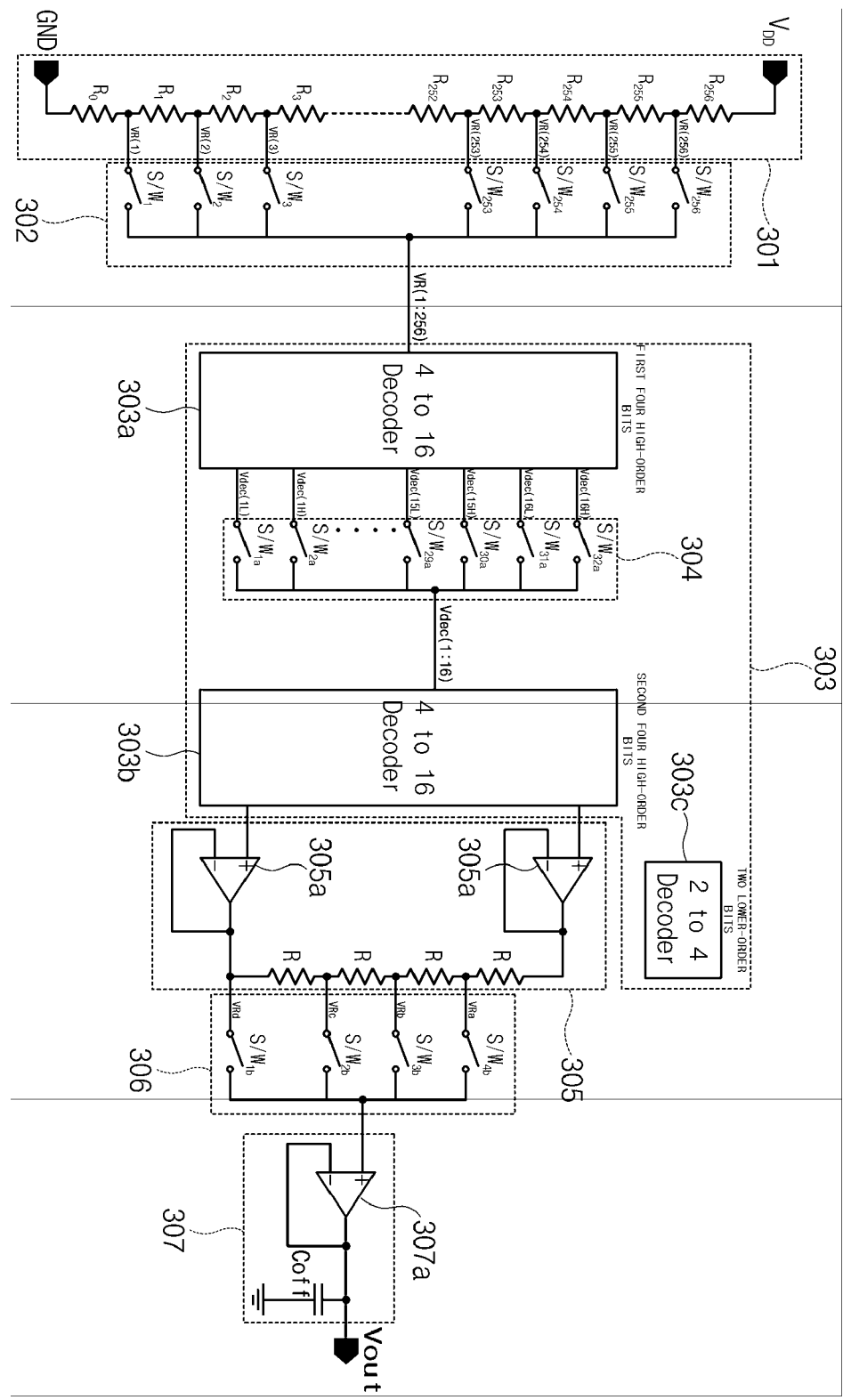
FIG. 3 is a block diagram illustrating the construction of a digital/analog converter according to an embodiment of the present invention.

FIG. 3 is a block diagram illustrating the construction of a digital/analog converter according to an embodiment of the invention.

As shown in FIG. 3, the digital/analog converter according to the invention is composed of a first divided-voltage generating section 301 which divides a reference supply voltage $V_{DD}$ through the voltage distribution, a decoder section 303 which receives a digital signal so as to output a decoded selection signal, a first divided-voltage selecting section 302 which selects and outputs a plurality of divided-voltages among the divided-voltages generated from the first divided-voltage generating section 301 on the basis of the output selection signal, a second divided-voltage selecting section 304 which selects and outputs a plurality of divided-voltages among the divided-voltages generated from the first divided-voltage selecting section on the basis of the output selection signal, a second divided-voltage generating section 305 which divides the plurality of divided-voltages which are output from the second divided-voltage selecting section, a third divided-voltage selecting section 306 which selects a predetermined voltage among the divided-voltages generated from the second divided-voltage generating section on the basis of the selection signal, and a voltage output section 307 which outputs the predetermined voltage which is selected by the third divided-voltage selecting section.

The first divided-voltage generating section 301 is composed of 257 resistances which are connected in series. One end thereof receives the reference supply voltage $V_{DD}$, and the other end thereof is connected to the ground GND of the circuit. Further, predetermined divided-voltages VR1 to VR256 are respectively output from the connection points between the resistances $R_0$ to $R_{256}$, that is, nodes formed between the resistances of the first divided-voltage generating section 301.

For example, if the connection point between the resistances $R_1$ and $R_2$ is set to the first node and the total of 257 serially-connected resistances is referred to as Rtot, a divided-voltage VRn which is output from the Nth node can be calculated by the following equation: $Vn=(R_0+R_1+ \ldots +R_{n-1})/Rtot \times V_{DD}$ (n is in the range of 1 to 256).

The first divided-voltage selecting section 302 is provided with 256 switches $S/W_1$ to $S/W_{256}$ which are all composed of transistors. The switches $S/W_1$ to $S/W_{256}$ are respectively connected to the nodes formed in the first divided-voltage generating section 301.

The first divided-voltage selecting section 302 selects and outputs 16 divided-voltages among 256 divided-voltages generated by the first divided-voltage generating section 301 on the basis of the selection signal output from the decoder section 303 which will be described below.

When a digital signal with a 10-bit resolution is processed in the related art, 1024($2^{10}$) resistances and 1024 switches are needed to divide a reference supply voltage. In the present invention, however, only 257($2^{8}$+1) resistances and 256 switches are needed, which are required for processing a digital signal with an 8-bit resolution. Therefore, the size of an IC on which a digital/analog converter is mounted can be significantly reduced, which satisfies the miniaturization thereof according to current technology trends.

The second divided-voltage selecting section 304 is provided with 32 switches $S/W_{1a}$ to $S/W_{32a}$ which are composed of transistors. The switches $S/W_{1a}$ to $S/W_{32a}$ are respectively connected to 16 nodes selected from the first divided-voltage selecting section 302 and nodes which are respectively adjacent to the 16 nodes and have a lower voltage than the divided-voltage of the 16 nodes, among the nodes formed in the first divided-voltage generating section 301.

Therefore, the second divided-voltage selecting section 304 selects one divided-voltage as a high voltage among the 16 divided-voltages selected by the first divided-voltage selecting section 302 on the basis of the selection signal output by the decoder section 303, and selects a divided-voltage of the node adjacent to the node having the selected divided-voltage as a low voltage, which means the second divided-voltages selecting section 304 outputs two divided-voltages.

The decoder section 303 receives a 10-bit digital signal from the outside. The decoder section 303 is composed of a first decoder 303a which decodes four higher-order bits (first high-order bits) of the 10-bit digital signal output from the outside so as to output a decoded selection signal, a second decoder 303b which decodes four following bits (second high-order bits) thereof so as to output a decoded selection signal, and a third decoder 303c which decodes two lower-order bits thereof so as to output a decoded selection signal.

On the basis of the selection signal output from the first decoder 303a, the first divided-voltage selecting section 302 first selects 16 divided voltages among the 256 divided-voltages generated from the first divided voltage generating section 301.

On the basis of the selection signal output from the second decoder 303b, the second divided-voltage selecting section 304 selects one divided-voltage as a high voltage among the 16 divided-voltages selected by the first divided-voltage selecting section 302, and selects the divided-voltage of the node adjacent to the node having the selected divided-voltage as a low voltage.

On the basis of the selection signal output from the third decoder 303c, a third divided-voltage selecting section 306, which will be described below, selects one desired voltage among the divided-voltages generated from the second divided-voltage generating section 305.

The second divided-voltage generating section 305 is provided with output buffers 305a to which the high and low voltages selected by the second divided-voltage selecting section 304 are respectively input and a resistance array 305b which is composed of four serially-connected resistances. The respective resistances composing the resistance array 305b have the same resistance value R. Further, predetermined divided-voltages VRa to VRd are respectively output from the connection points between the resistances composing the resistance array 305b, that is, the nodes formed between the resistances of the second divided-voltage generating section 305.

Since the second divided-voltage generating section 305 is composed of the resistance array 305b which is composed of four resistances having the same resistance value R, the 256 divided-voltages generated by the first divided-voltage generating section 301 are quadrisected so as to have the same magnitude. Therefore, the same effect as the first divided-voltage generating section 301 is composed of 1024 resistances can be obtained. According to the present invention, the digital/analog converter has such an advantage that the size thereof becomes smaller than that of a conventional digital/analog converter processing a digital signal with a 10-bit resolution.

Into the output buffer 305a, the input high or low voltage is fed back as an auxiliary input. The output buffer 305a does not form a current path but transmits only a voltage. Therefore, with the voltage of each node of the first divided-voltage generating section 301 being maintained, the same voltage as a voltage which a user wants is output through the voltage output section 306 which will be described below.

In other words, if the second divided-voltage generating section 305 is composed of only the resistance array 305b without the output buffer 305a, the plurality of resistances composing the resistance array 305b causes a current path to be formed, so that a current flows into the resistance array 305b. Then, since the voltage of each node of the first divided-voltage generating section 301 cannot be maintained, the same voltage as a voltage which a user wants cannot be output.

The third divided-voltage selecting section 306 is provided with four switches $S/W_{1b}$ to $S/W_{4b}$ which are all composed of transistors. The switches $S/W_{1b}$ to $S/W_{4b}$ are respectively connected to the nodes formed on the second divided voltage generating section 305.

Therefore, the third divided-voltage selecting section 306 selects and outputs one desired voltage among four divided voltages generated by the second divided-voltage generating section 305 on the basis of the selection signal output from the third decoder 303c of the decoder section 303.

The voltage output section 307 is composed of an output buffer 307a which buffers and outputs one voltage selected by the third divided-voltage selecting section 306.

The voltage selected by the third divided-voltage selecting section 306 is output to an output terminal through the output buffer 307a. Accordingly, the output voltage of an analog signal corresponding to a 10-bit digital signal which is input from the outside is output through the output terminal of the digital/analog converter according to the present invention.

As in the related art, the output buffer 307a is used in the voltage output section 307. Accordingly, a desired voltage and driving speed can be realized, and the flickering of the distributed voltage can be prevented.

While the present invention has been described with reference to exemplary embodiments thereof, it will be understood by those skilled in the art that various changes and modifications in form and detail may be made therein without departing from the scope of the present invention as defined by the following claims.

According to the digital/analog converter of the present invention, the divided-voltage generating sections and the divided-voltage selecting sections are respectively added to a conventional digital/analog converter which processes a digital signal with 8-bit resolution. Such a construction allows a digital signal with high resolution of more than 10 bits to be processed. Further, the digital/analog converter can be miniaturized to thereby obtain such an effect that the size of an IC on which the digital/analog converter is mounted can be reduced.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A digital/analog converter comprising:
a first divided-voltage generating section which divides a reference supply voltage through the voltage distribution;
a decoder section which receives a digital signal so as to output a decoded selection signal;
a first divided-voltage selecting section which selects and outputs a plurality of divided voltages among the divided voltages generated from the first divided-voltage generating section on the basis of the selection signal output from the decoder section;
a second divided-voltage selecting section which selects and outputs a plurality of divided voltages among the divided-voltages output from the first divided-voltage selecting section on the basis of the selection signal output from the decoder section;
a second divided-voltage generating section which divides the plurality of divided-voltages output from the second divided-voltage selecting section and which is composed of a plurality of switches which are respectively connected to a plurality of nodes which are selected by the first divided-voltage selecting section and nodes which are adjacent to the plurality of nodes selected by the first divided-voltage selecting section;
a third divided-voltage selecting section which selects a predetermined voltage among the divided-voltages output from the second divided-voltage generating section on the basis of the selection signal output from the decoder; and
a voltage output section which outputs the predetermined voltage selected from the third divided-voltage selecting section.

2. The digital/analog converter according to claim 1, wherein the first divided-voltage generating section is composed of a plurality of serially-connected resistance elements.

3. The digital/analog converter according to claim 1, wherein the first divided-voltage selecting section is composed of a plurality of switches which are respectively connected to a plurality of nodes formed in the first divided-voltage generating section.

4. The digital/analog converter according to claim 3, wherein the plurality of switches are composed of transistors.

5. The digital/analog converter according to claim 1 wherein the second divided-voltage selecting section selects the voltage of the plurality of nodes selected by the first divided-voltage selecting section as a high voltage, and selects the voltage of the nodes adjacent to the plurality of nodes selected by the first divided-voltage selecting section as a low voltage.

6. The digital/analog converter according to claim 1, wherein the second divided-voltage generating section is composed of a plurality of output buffers, into which the plurality of divided-voltages are respectively input, and a plurality of serially-connected resistance elements.

7. The digital/analog converter according to claim 6, wherein, in the output buffers, the plurality of divided-voltages are fed back as an auxiliary input.

8. The digital/analog converter according to claim 6, wherein the plurality of resistance elements respectively have the same resistance value.

9. The digital/analog converter according to claim 1, wherein the third-divided voltage selecting section is composed of a plurality of switches which are respectively connected to a plurality of nodes formed in the second divided-voltage generating section.

10. The digital/analog converter according to claim 9, wherein the plurality of switches are composed of transistors.

11. The digital/analog converter according to claim 1, wherein the voltage output section is composed of an output buffer which buffers and outputs the predetermined voltage selected by the third divided-voltage selecting section.

12. The digital/analog converter according to claim 11, wherein, in the output buffer, the predetermined voltage is fed back as an auxiliary input.

13. The digital/analog converter according to claim 1, wherein the plurality of switches are composed of transistors.

* * * * *